United States Patent
Hughes et al.

(10) Patent No.: US 6,816,009 B2
(45) Date of Patent: Nov. 9, 2004

(54) CIRCUIT AND METHOD FOR A TRANSIMPEDANCE AUDIO AMPLIFIER PROVIDING VARIABLE GAIN WHILE MAINTAINING LOAD IMPEDANCE

(75) Inventors: William Edward Hughes, Scottsdale, AZ (US); Richard W. Faith, Phoenix, AZ (US)

(73) Assignee: Fender Musical Instruments, Inc., Scottsdale, AZ (US)

(*) Notice: Subject to any disclaimer, the term of this patent is extended or adjusted under 35 U.S.C. 154(b) by 0 days.

(21) Appl. No.: 10/199,623

(22) Filed: Jul. 19, 2002

(65) Prior Publication Data

US 2004/0012440 A1 Jan. 22, 2004

(51) Int. Cl.[7] .................................................. H03F 1/36
(52) U.S. Cl. ............................................ 330/85; 330/86
(58) Field of Search ............................. 330/85, 86, 144, 330/282, 284; 381/120, 121

(56) References Cited

U.S. PATENT DOCUMENTS 5,682,121 A * 10/1997 Naokawa et al. ........... 330/252
5,905,802 A * 5/1999 Megeid ....................... 381/108
5,973,368 A * 10/1999 Pearce et al. ............... 257/368

* cited by examiner

Primary Examiner—Linh M. Nguyen
(74) Attorney, Agent, or Firm—Robert D. Atkins; Quarles & Brady Streich Lang LLP

(57) ABSTRACT

A transimpedance amplifier (18) receives an audio signal from a power audio amplifier (14) and provides a variable power level to a loudspeaker (16). A first variable gain amplifier (28) receives the audio signal and provides a variable gain to a power amplifier (40). The output signal of the power amplifier drives the loudspeaker. A sense amplifier (52) subtracts a voltage representative of current flowing through the loudspeaker from a voltage applied to the loudspeaker and provides a difference signal. A second variable gain amplifier (70) receives the difference signal and provides a variable gain to a load amplifier (80). The gains of the first and second variable gain amplifiers are inversely proportional. A resistive element (84) having a real impedance is coupled between an output of the load amplifier and the input of the transimpedance amplifier to maintain the complex impedance of the loudspeaker at the output of the power audio amplifier.

26 Claims, 2 Drawing Sheets

CIRCUIT AND METHOD FOR A TRANSIMPEDANCE AUDIO AMPLIFIER PROVIDING VARIABLE GAIN WHILE MAINTAINING LOAD IMPEDANCE

FIELD OF THE INVENTION

The present invention relates in general to amplifier circuits and, more particularly, to a transimpedance audio amplifier for providing variable power levels while maintaining a constant complex load impedance.

BACKGROUND OF THE INVENTION

Audio or instrument amplifiers have long been used to control the sound amplification, equalization, filtering, special effects, and other signal processing of the audio signal. The audio signal is generated by an audio source and then amplified and filtered by the power audio amplifier. Common examples of the audio source include a musical instrument, such as a guitar, a receiver and tuner, and a microphone. The power audio amplifier is typically a separate unit from the audio source. The amplified and filtered audio signal then drives a loudspeaker.

Audio amplifiers are available in a wide assortment of design technologies, power amplification capabilities, frequency responses, enclosures, and price ranges; each offered with particular end applications in mind. There are electronic or solid state power audio amplifiers, and there are vacuum tube power audio amplifiers, with output power ratings from less than 10 to more than 100 watts, over a frequency range of approximately 20 to 20 K hertz. In the music industry, and more particularly, for musical instruments such as guitars, the vacuum tube power audio amplifier offers certain desirable characteristics for the end user or artist. As popular music has evolved, some musicians, including guitarists, have developed playing styles that involve intentionally overdriving their power audio amplifiers into distortion or nonlinear region to achieve a unique sound effect. The vacuum tube power audio amplifier offers certain inherent physical and design inaccuracies that allow or aid in the generation of the distortion within its frequency response.

The desired distortion effect is generally attainable only when the power audio amplifier is operated at substantially high volume levels. Unfortunately, other people within earshot do not always have the same appreciation as the artist for his/her music. Thus, at times, the artist is prevented from playing the overdrive style because of the loudness, disturbance, or annoyance perceived by others. Although the artist can use earphones if they desire that others not hear the music, such devices can be uncomfortable or inconvenient to wear and tend to restrict movement. Earphones do not have the same sound quality and acoustic properties as a high performance loudspeaker. Moreover, there can be damage to the inner ear from long term exposure to exceptionally loud music or sounds.

In the prior art, some instrument amplifiers provide preamplifier distortion with a master volume control as a way of playing in an overdrive style while maintaining a reasonable acoustic volume level. However, preamplifier distortion generally sounds quite different from power audio amplifier distortion, particularly the variety of amplifier distortion that is characteristic of the vacuum tube power audio amplifier. The artist does not achieve the same sound effects as provided through power audio amplifier distortion.

Another known approach is to place a passive attenuator, such as a T-pad, between the power audio amplifier and the loudspeaker. The vacuum tube power audio amplifier has a complex output impedance, i.e. with resistive and reactive components. Likewise, the loudspeaker has a complex impedance, which is matched to or interacts with the complex output impedance of the power audio amplifier in a manner greatly affecting the overdrive distortion characteristics of the power amplifier-loudspeaker system. The passive attenuator isolates the complex impedance of the loudspeaker from the complex output impedance of the power audio amplifier. When using a passive attenuator, the power audio amplifier is no longer driving the loudspeaker, but rather it is driving the passive attenuator. The passive attenuator between the power audio amplifier and the loudspeaker creates a mismatch or otherwise compromises the interaction between the amplifier output impedance and the load impedance and interferes with the desired distortion sound effects.

A need exists for an audio or instrument amplifier that produces a level of distortion at many different acoustic volume levels while preserving the interaction of the power amplifier output impedance and the loudspeaker impedance.

DETAILED DESCRIPTION OF THE DRAWINGS

Figure 1:
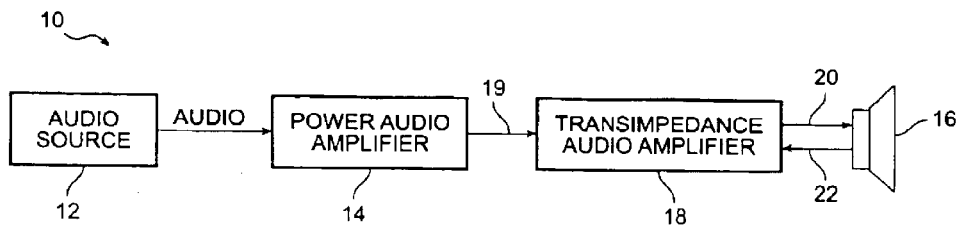
FIG. 1 is a block diagram of a power amplifier and loudspeaker system with intermediate transimpedance amplifier.

Referring to FIG. 1, a simplified block diagram of power amplifier and loudspeaker system 10 is shown. Audio source 12 generates an audio signal. Audio source 12 may be a musical instrument, such as a guitar, a receiver and tuner, or a microphone receiving a human voice. The audio signal is routed to power audio amplifier 14 which controls the sound amplification, equalization, filtering, special effects, and other signal processing of the audio signal. Power audio amplifier 14 can have an electronic or solid state design, a passive network design, or for other uses and applications it may have a vacuum tube design, with an output power rating of 10–100 watts and up, over a frequency range of approximately 20 to 20 K hertz.

The output stage of power audio amplifier 14 has a complex output impedance $Z_A$ having resistive and reactive components. Power audio amplifier 14 drives loudspeaker 16 to reproduce the audio signal. Loudspeaker 16 also has a complex impedance $Z_S$ having resistive and reactive components. For better sound quality and effects, the complex impedance $Z_S$ is matched to or interacts with the complex output impedance $Z_A$. The interaction of impedances $Z_A$ and $Z_S$ contributes substantially to the characteristic tone color of the system both in and out of the overdrive mode, and should be preserved.

In many applications, it is desirable to control the power level delivered to loudspeaker 16. Transimpedance audio amplifier 18 is coupled intermediate between power audio amplifier 14 and loudspeaker 16 to provide such control over the power level of the audio signal delivered to loudspeaker 16. The output of power audio amplifier 14 is coupled to an input of transimpedance audio amplifier 18 by conductor 19. The first and second outputs of transimpedance audio amplifier 18 are coupled to loudspeaker 16 by conductors 20 and 22, respectively. As an additional feature and benefit, transimpedance audio amplifier 18 also maintains a complex impedance $Z_S$ as seen by the output stage of power audio amplifier 14 independent of the power level delivered to loudspeaker 16.

The purpose of transimpedance audio amplifier 18 is to preserve the precise complex loading of loudspeaker 16 on power audio amplifier 14, while providing the ability to vary the power level of the audio signal actually delivered to loudspeaker 16. In other words, power audio amplifier 14 may be controlled to provide the power levels necessary to drive loudspeaker 16, possibly in an overdrive mode, to create distortion or other nonlinear acoustic effects which the artist or end user finds useful or desirable. Transimpedance audio amplifier 18 provides the ability to increase and decrease the power level of the audio signal to loudspeaker 16, and therefore control the audible sound level emanating from the loudspeaker, while maintaining the same effective dynamic load $Z_S$ on power audio amplifier 14. The complex impedance $Z_S$ as seen by power audio amplifier 14 remains constant, independent of the power level delivered to loudspeaker 16. The artist or end user can set power audio amplifier 14 to any power level, e.g. increase the volume to create distortion, and then utilize transimpedance amplifier 18 to decrease the power level to loudspeaker 16 to a more acceptable audible level. The sound quality and characteristics of the audio signal as delivered to loudspeaker 16 remain the same because the operation of transimpedance audio amplifier 18 causes power audio amplifier 14 to continue to see the same complex impedance $Z_S$.

Transimpedance audio amplifier 18 may be integral to the unit containing power audio amplifier 14, or integral to the unit containing loudspeaker 16, or a stand-alone unit coupled by cables intermediate between power audio amplifier 14 and loudspeaker 16.

Figure 2:
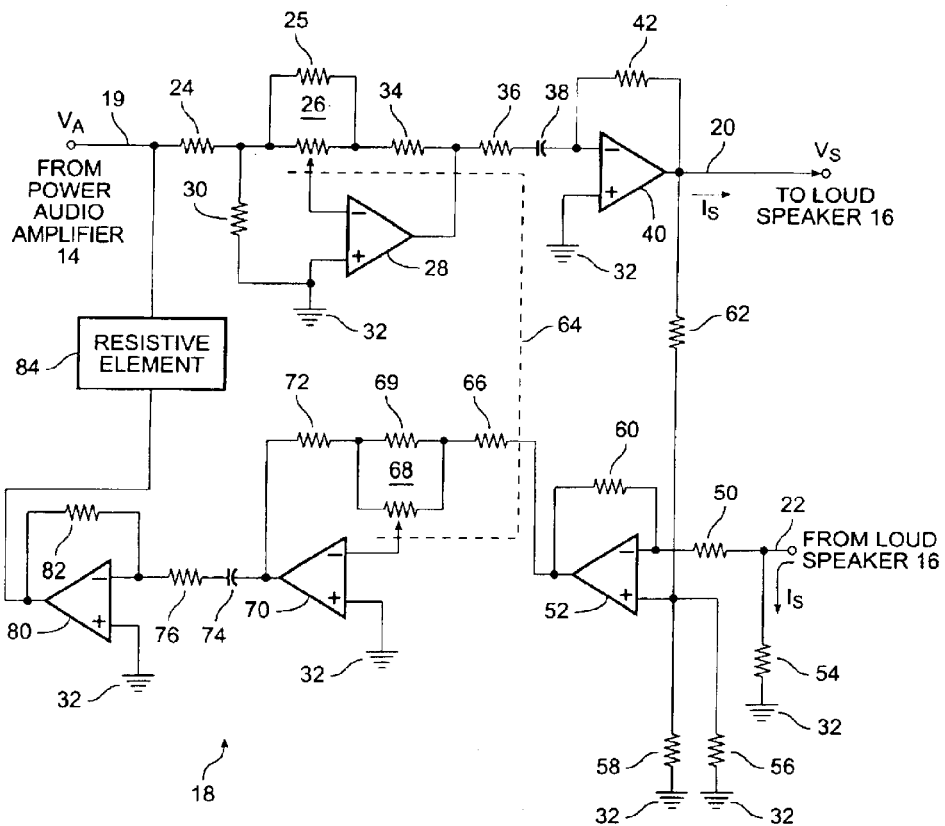
FIG. 2 is a schematic diagram of the transimpedance amplifier of FIG. 1.

Further detail of transimpedance audio amplifier 18 is shown in FIG. 2. In the forward signal path, the amplified audio signal from power audio amplifier 14 is a voltage $V_A$ which is applied through resistor 24 and variable resistor circuit 26 to the inverting input of differential operational amplifier 28. Variable resistor circuit 26 may be implemented as an electrically driven or mechanically driven linear-taper potentiometer having a value of typically 10.0 Kohms with a fixed resistor 25 connected in parallel with the potentiometer. Resistor 30 is coupled between a terminal of resistor 24 and power supply conductor 32 operating at ground potential. The non-inverting input of operational amplifier 28 is coupled to power supply conductor 32. A feedback resistor 34 is coupled between the output of operational amplifier 28 and the terminals of potentiometer 26 and resistor 25 that are not connected to resistors 24 and 30. The signal input and feedback are coupled to the inverting input of amplifier 28 through the arm of potentiometer 26. Resistors 24 and 30 are chosen to have a parallel-equivalent value equal to resistor 34 and to produce such gain reduction as to ensure that the voltage $V_A$ cannot drive operational amplifier 28 into clipping. Resistor 25 is set to approximately one tenth the value of potentiometer 26 so that the tolerance of potentiometer 26 will not substantially affect circuit performance. Operational amplifier 28 operates as a first variable or controllable gain amplifier having a variable gain $K_{28}$ selectable by variable resistor circuit 26.

The output of operational amplifier 28 is coupled through a series combination of resistor 36 and capacitor 38 to the inverting input of differential operational amplifier 40. Resistor 36 is set to a convenient value such as 1.0 Kohms. Capacitor 38 prevents amplification of the DC offset voltages of operational amplifiers 28 and 40. The non-inverting input of operational amplifier 40 is coupled to power supply conductor 32 to receive the ground potential. A feedback resistor 42 is coupled between the output of operational amplifier 40 and its inverting input. Operational amplifier 40 is a linear power amplifier having a fixed gain $K_{40}$, as established by the ratio of the values of resistors 42 and 36. Operational amplifier 40 is capable of receiving the maximum unloaded output voltage from variable-gain amplifier 28 (set to its maximum gain) while audio power amplifier 14 is delivering its maximum unloaded output voltage with potentiometer 26 set for maximum $K_{28}$ gain, and driving loudspeaker 16 as a load under all normal operating conditions without introducing further distortion. The output of operational amplifier 40 is coupled to loudspeaker 16 by conductor 20 to apply a voltage $V_S$ to loudspeaker 16 and cause a current $I_S$ to flow through loudspeaker conductors 20 and 22 and the complex impedance $Z_S$.

In the return signal path from loudspeaker 16, resistor 50 is coupled between loudspeaker conductor 22 and the inverting input of differential operational amplifier 52. Resistor 54 is coupled between loudspeaker conductor 22 and power supply conductor 32. The vast majority of the loudspeaker current $I_S$ flows through resistor 54 and develops a voltage at the inverting input of operational amplifier 52 representative of the current $I_S$. The value of resistor 54 ($R_{54}$) is typically made about 0.1 ohms, much less than the magnitude of the complex impedance $Z_S$.

A parallel combination of resistors 56 and 58 is coupled between the non-inverting input of operational amplifier 52 and power supply conductor 32. A feedback resistor 60 is coupled between the output of operational amplifier 52 and its inverting input. A voltage sense resistor 62 is coupled between the output of operational amplifier 40 and the non-inverting input of operational amplifier 52 to provide a signal representative of the voltage $V_S$ applied to loudspeaker 16. Resistors 56 and 58 function in conjunction with resistor 62 to form a voltage divider to set the gain of operational amplifier 52 with respect to the voltage $V_S$. Operational amplifier 52 operates as a sense amplifier having a fixed gain $K_{52}$. Operational amplifier 52 receives a voltage representative of the loudspeaker voltage $V_S$ at its non-inverting input and a voltage representative of the loudspeaker current $I_S$ at its inverting input. Operational amplifier 52 thus subtracts a signal representative of the loudspeaker voltage $V_S$ from a signal representative of the loudspeaker current $I_S$ and provides a difference output signal multiplied by the gain $K_{52}$.

The value of resistor 50 ($R_{50}$) is selected in the range $1000*R_{54} < R_{50} < 1000$ ohms. The value of resistor 56 ($R_{56}$) is made equal to $R_{50}$. The value of resistor 60 ($R_{60}$) is selected according to the relationship $R_{60}=(R_{50}R_{84})/(R_{54}K_{28}K_{40}K_{70}K_{80})$, where $K_{28}$ is the magnitude of voltage gain from node $V_A$ to the output of operational amplifier 28 and $K_{70}$ is the magnitude of voltage gain from the output of operational amplifier 52 to the output of operational amplifier 70. Although $K_{28}$ and $K_{70}$ are both variable, their product is held constant by linkage 64 joining their respective control potentiometers 26 and 68. Operational amplifier 52 is calibrated such that: (1) if loudspeaker 16 is disconnected, then the voltage at the output of operational amplifier 80 (typically a power operational amplifier) will be essentially identical to voltage on conductor 19 resulting in zero current through resistive element 84, and (2) with loudspeaker 16 connected, the current $I_{84}$ flowing through resistive element 84 is essentially the same as the loudspeaker current $I_S$ divided by the products of voltage gains $K_{28}K_{40}$ of operational amplifiers 28 and 40.

The value of resistor 62 ($R_{62}$) and resistor 58 ($R_{58}$) are selected so that the common-mode rejection of operational amplifier 52 is optimized according to the following two constraints:

$$R_{60} = R_{58} \| R_{62} \qquad (1)$$

$$\frac{R_{56} \| R_{58}}{(R_{56} \| R_{58}) + R_{62}} = \frac{1}{K_{28} K_{40} K_{70} K_{80} \left( \frac{R_{60}}{R_{50}} + 1 \right)} \qquad (2)$$

The output signal of operational amplifier 52 is applied through resistor 66 and variable resistor circuit 68 to the inverting input of operational amplifier 70. Variable resistor circuit 68 may be implemented as an electrically driven or mechanically driven linear-taper potentiometer having a value of typically 10.0 Kohms with a fixed resistor 69 connected in parallel with the potentiometer. The non-inverting input of operational amplifier 70 is coupled to power supply conductor 32. A feedback resistor 72 is coupled between the output of operational amplifier 70 and the junction of potentiometer 68 and resistor 69 not connected to resistor 66. The arm of potentiometer 68 is coupled to the inverting input of operational amplifier 70. The value of resistor 66 is selected to be equal to resistor 72. The value or resistor 69 is set to approximately one tenth the value of potentiometer 68, so as to relegate the resistance tolerance of the latter to insignificance. Operational amplifier 70 operates as a second variable or controllable gain amplifier having a variable gain $K_{70}$ selectable by variable resistor circuit 68.

The control mechanisms to variable resistor circuits 26 and 68 are driven in tandem. For example, the mechanical control to the respective potentiometers of variable resistor circuits 26 and 68 are driven in opposite directions from a common shaft or linkage as shown by reference number 64. In this manner, the controllable gains of operational amplifiers 28 and 70 can be made reciprocally variable ($K_{28}=C/K_{70}$) where C is a constant, or inversely proportional, such that the product of their respective voltage gains is a constant value. The constant voltage gain product of operational amplifiers 28 and 70 results in a constant value of gain of transimpedance audio amplifier 18 as a whole. As variable gain operational amplifier 28 increases the power delivered to loudspeaker 16, variable gain operational amplifier 70 decreases the gain in the return path by precisely the same ratio. As variable gain operational amplifier 28 decreases the power delivered to loudspeaker 16, variable gain operational amplifier 70 increases the gain in the return path again by the same ratio. The reciprocal gains in the forward and return signal paths of transimpedance audio amplifier 18 ensure that the power to loudspeaker 16 may be varied while maintaining a constant loudspeaker impedance to the output stage of power audio amplifier 14.

In an alternative embodiment, variable or controllable gain operational amplifiers 28 and 70 may be implemented as multiplying digital to analog converters (DAC) or other controllable multiplying and dividing circuits.

The output of operational amplifier 70 is coupled through a series combination of capacitor 74 and resistor 76 to the inverting input of operational amplifier 80. Capacitor 74 prevents undesirable amplification of the DC offset voltage of operational amplifiers 70 and 80. The non-inverting input of operational amplifier 80 is coupled to power supply conductor 32 to receive the ground potential. A feedback resistor 82 is coupled between the output of operational amplifier 80 and its inverting input. Operational amplifier 80 is a linear load amplifier having a fixed gain $K_{80}$. The maximum unloaded output voltage swing of operational amplifier 80, and its current delivery capability, are capable of exceeding those same attributes of power audio amplifier 14, so that no distortion is contributed by operational amplifier 80.

A resistive element 84 is coupled between the output of operational amplifier 80 and conductor 19. Resistive element 84 may be implemented in a variety of techniques including carbon resistor, thin film resistor, polysilicon resistor, field effect transistor, or any other circuit element having a predominately real impedance and resistive characteristics. The value of resistive element 84 ($R_{84}$) is made about 8.0 ohms, approximately equal to the magnitude of the complex impedance $Z_S$.

Operational amplifiers 28, 40, 52, 70, and 80 are typically constructed with transistors and other active and passive devices in any base silicon technology such as bipolar and metal oxide semiconductor (MOS).

The operation of transimpedance audio amplifier 18 is explained with the following simplified equations. The forward signal path from power audio amplifier 14 to loudspeaker 16 can be described as $V_S = K_{28} K_{40} V_A$. The current $I_S$ flowing through the complex impedance $Z_S$ of loudspeaker 16 is given as $I_S = (K_{28} K_{40} V_A)/Z_S$. In the return path, sense amplifier 52 operates as a summing circuit which subtracts a voltage across resistor 54 given as $R_{54} (K_{28} K_{40} V_A/Z_S)$, assuming $R_{50} \gg R_{54}$, which is representative of the loudspeaker current $I_S$, from the loudspeaker voltage $K_{28} K_{40} V_A$ received via resistor 62. The output voltage $V_{80}$ of operational amplifier 80 is given as $V_{80} = K_{80} K_{70} K_{28} K_{40} V_A (KV_{52} - R_{54} R_{60}/(R_{50} Z_S))$, where $KV_{52} = (1 + (R_{60}/(R_{50} + R_{54})))((R_{56} \| R_{58})/(R_{62} + (R_{56} \| R_{58})))$. If $R_{50} > 100 R_{54}$, then $R_{54}$ may be treated as zero in the above computation of $KV_{52}$. In addition, provided that $R_{50} > 100 R_{54}$ and $R_{50} \| R_{60} = R_{56} \| R_{58} \| R_{62}$, the simplification "$KV_{52} = R_{60}/R_{62}$" becomes valid. Given that $K_{28} = 1C/K_{70}$, then $V_{80}$ reduces to $V_A C K_{40} K_{80} (KV_{52} - R_{54} R_{60}/(R_{50} Z_S))$. The actual load current seen by power audio amplifier 14 is $I_L = (V_A - V_{80})/R_{84}$. The actual load impedance seen by power audio amplifier 14 is $Z_L = V_A/I_L = V_A/[(V_A - V_{80})/R_{84}]$. Substituting for the above expression for $V_{80}$:

$$Z_L = \frac{V_A}{\left( V_A - \left( C V_A K_{40} K_{80} \left( KV_{52} - \frac{R_{54} R_{60}}{R_{50} Z_S} \right) \right) \right)} \qquad (3)$$

$$Z_L = \frac{R_{84}}{1 - C K_{40} K_{80} KV_{52} + \frac{C K_{40} K_{80} R_{54} R_{60}}{R_{50} Z_S}} \qquad (4)$$

If the product $CK_{40} K_{80} KV_{52}$ is set by design to be unity and a constant M is defined as $M = R_{50} R_{84}/(CK_{40} K_{80} R_{54} R_{60})$, then equation (4) simplifies to $Z_L = MZ_S$. Transimpedance audio amplifier 18 has provided an actual load impedance $Z_L$ as seen by power audio amplifier 14 as a constant multiple of the complex impedance $Z_S$ of loudspeaker 16. Moreover, transimpedance audio amplifier 18 has the ability to change the power level delivered to loudspeaker 16 by adjusting the gains $K_{28}$ and $K_{70}$ of operational amplifiers 28 and 70 with variable resistor circuits 26 and 68, respectively. Power audio amplifier 14 can be operated at any power level, according to the amount of distortion or other sound effects desired by the artist or end user. The power level delivered to loudspeaker 16 can be controlled over a wide range, i.e. with unity gain, less than unity gain, or greater than unity gain. Loudspeaker 16 achieves the same performance, independent of the power level, because the complex impedance $Z_S$ is continuously mirrored back to the output stage of power audio amplifier 14. Thus, the artist or end user can reproduce the desired unique distortion sound quality and characteristics with a different (typically lower) audible volume level.

Some additional design selection considerations are provided as follows. In order to assure that the output waveform delivered to the loudspeaker is an accurate replica of the output waveform of the power audio amplifier 14, and to assure at the same time that the load mirrored back to the latter power amplifier is an accurate replica of the loudspeaker impedance, it may be necessary to provide such output headroom at each stage so that under no operating condition can any stage within the transimpedance amplifier be driven into clipping; nevertheless, any stage that is designed too conservatively in this regard may compromise the signal-to-noise ratio of the transimpedance amplifier as a whole. For operational amplifiers 28 and 40, the worst-case output-voltage swing will occur when audio power amplifier 14 is delivering its maximum possible output voltage into an open circuit (loudspeaker disconnected), and potentiometer 26 is set for maximum gain. In the case of operational amplifiers 52, 70 and 80, the same worst-case scenario applies, with one additional constraint: additional voltage-swing headroom of approximately 3 dB should be designed into these operational amplifiers. The reason for creating the additional safety factor is that if a pure reactive load nominally equal in magnitude to the specified load impedance for power audio amplifier 14 is connected alone across the loudspeaker terminals, the voltages $V_{52}$, $V_{70}$ and $V_{80}$ will be root 2 times the values they assume when the loudspeaker terminals are open-circuited.

The following is a detailed procedure for choosing the values for resistors 50, 54, 56, 58, 60 and 62. Assuming worst-case conditions, let the symbol $V_{14p}$ represent the maximum peak voltage that the audio power amplifier 14 can deliver into an open circuit at the inception of clipping and let the symbol $V_{52p}$ represent the maximum peak voltage that operational amplifier 52 can produce at its output terminal without clipping. Set the value of resistor 54 to less than 2% of the nominal $Z_S$ value (for example, if the nominal $Z_S$ value is 8 ohms, 0.1 ohm is a good choice for the value of resistor 54). Set the values of resistors 50 and 56 to be about 1000 times the value of resistor 54 (in this case, 100 ohms). Let the expression $K_{FMAX}$ (maximum value of the forward signal-path gain) represent the product of $K_{28}$ and $K_{40}$ that will exist when potentiometer 26 is set for maximum gain; note this value of $K_{FMAX}$. The desired value for $KV_{52}$ will then be determined by the formula $KV_{52}=(\sqrt{2}/2)(V_{52p}/(V_{14p}K_{FMAX}))$; note this value of $KV_{52}$. Let the symbol $R_S$ represent a pure resistance equal in magnitude to the rated loudspeaker impedance $Z_S$. Choose $R_{60}$ using the formula:

$$R_{60} = \frac{\sqrt{2}\, V_{52p} R_{50}(R_{54} + R_S)}{2 V_{14p} K_{FMAX} R_{54}} \quad (5)$$

Choose $R_{62}$ using the formula:

$$R_{62} = \frac{2 K_{FMAX} R_{60} V_{14p}}{\sqrt{2}\, V_{52p}} \quad (6)$$

Note that this formula for $R_{62}$ will set $KV_{52}$ to its desired value of:

$$KV_{52} = \frac{\sqrt{2}\, V_{52p}}{2 V_{14p} K_{FMAX}} \quad (7)$$

only if the two differential inputs of operational amplifier 52 look into equal net resistances. In order to achieve the latter condition, set $R_{58}$ according to the formula $$R_{58} = \frac{1}{\dfrac{1}{R_{50}} + \dfrac{1}{R_{60}} - \dfrac{1}{R_{56}} - \dfrac{1}{R_{62}}} \quad (8)$$

The value of $V_{80}/V_{52}$ is estimated upon the assumption that $R_{24}=R_{36}$ and the net resistances looking into the two inputs of operational amplifier 52 are equal. The latter condition will be produced by setting $R_{72}=1/(1/(R_{25}\|R_{24})-1/(R_{36}\|R_{34}))$. Choose the value of resistor 25 ($R_{25}$) such that with $V_{52}=0$ and an external source of 1.0 VRMS connected through a resistance equal in magnitude to the rated load impedance for power audio amplifier 14 to the junction of $R_{24}$ and $R_{30}$, then the RMS value of $V_{80}$ will be equal to $V_{52}R_{25}/R_{34}$.

A design check for operational amplifier 52 is to determine the value of $V_{80}$ that is developed when $V_S$ is 1.0 VRMS and a resistance equal in magnitude to the rated load impedance for power audio amplifier 14 is connected across the transimpedance amplifier output terminals in place of loudspeaker 16. The voltage $V_{80}$ should have a very small value. Furthermore, as the load resistance passes through some value, the voltage $V_{80}$ will pass through a null. The more nearly the null-producing value of load resistance approximates in magnitude to the rated load impedance of power audio amplifier 14, the more correctly operational amplifier 52 has been designed.

A global gain and phase check necessary as additional verification of system integrity is to energize the transimpedance amplifier 18 using the audio source 12, with the loudspeaker load disconnected. In this operating condition, the product $K_{28}K_{40}KV_{52}K_{70}K_{80}$ should equal unity, with minimal phase shift (ideally zero degrees at all frequencies of interest). The best indication that the latter has been achieved is a lack of any voltage across the terminals of resistive element 84, or in other words, $V_{80}=V_A$ under the no-load condition.

Figure 3:
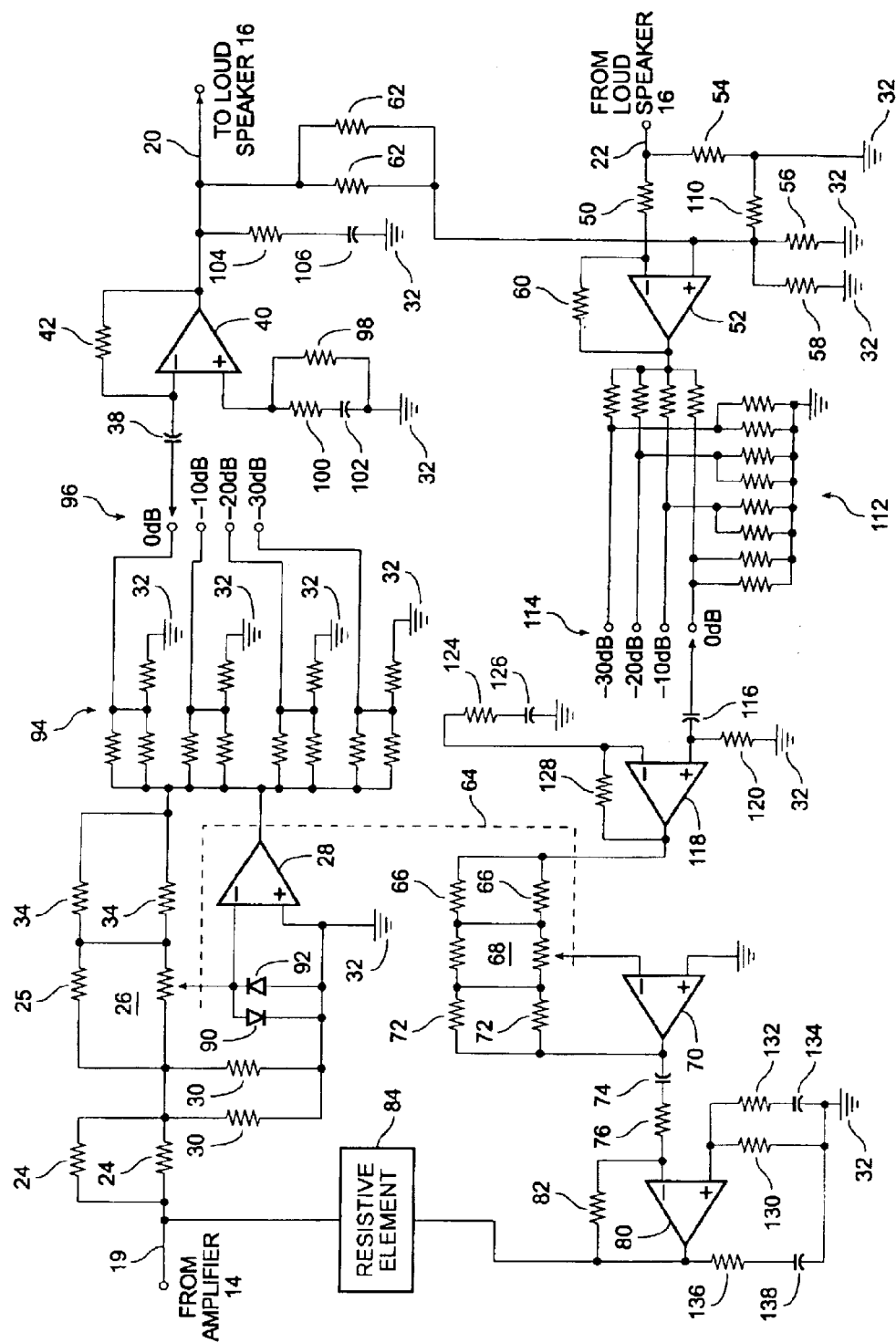
FIG. 3 is an alternative embodiment of the transimpedance amplifier of FIG. 1.

Turning to FIG. 3, an alternative embodiment of the transimpedance audio amplifier is shown. Circuit elements providing a similar function are assigned the same reference numbers used in FIG. 2. Resistors 24, 30, and 34 are each shown as two resistors in parallel. Back-to-back diodes 90 and 92 are coupled between the inverting input of operational amplifier 28 and power supply conductor 32 operating at ground potential. Resistor 36 is replaced with a resistor network 94 and switching circuit 96 to extend the amplification range of the forward signal path. The four terminals of switching circuit 96 can be configured to provide 0 dB, −10 dB, −20 dB, and −30 dB of gain, respectively, for the forward signal path as a whole. The inverting input of operational amplifier 40 is switched between the four terminals of switching circuit 96. Switching circuit 96 can be implemented with MOS pass transistors operating under control of a control circuit.

The non-inverting input of operational amplifier 40 is coupled to power supply conductor 32 by way of resistors 98 and 100 and capacitor 102. The output of operational amplifier 40 is coupled through a series combination of resistor 104 and capacitor 106 to power supply conductor 32. Resistor 62 is shown as two resistors in parallel. A resistor 56 is coupled between the non-inverting input of operational amplifier 52 and power supply conductor 32. Resistor 58 is shown as two resistors in parallel. Resistor 66 is replaced with a A resistor network 112, a and switching circuit 114, and a buffer amplifier comprising operational amplifier 118, capacitors 116 and 126, and resistors 120, 124 and 128 have been interposed between the output terminal of operational amplifier 52 and resistor(s) 66 to extend the amplification range of return signal path. The four terminals of switching circuit 114 can be configured to provide −30 dB, −20 dB, −10 dB, and 0 dB of gain reduction, respectively, for the return signal path as a whole. Linkage 150 provides that switching circuits 94 and 112 are controlled in tandem, such that as the forward signal path gain is increased, the return signal path gain is correspondingly reduced, thus maintaining an invariant value for the product of the forward and return signal path gains as the switching circuits are operated. Switching circuit 114 can be implemented with MOS pass transistors operating under control of a control circuit.

One of the four terminals of switching circuit 114 is coupled through capacitor 116 to the non-inverting input of operational amplifier 118. The non-inverting input of operational amplifier 118 is also coupled through resistor 120 to power supply conductor 32. The inverting input of operational amplifier 118 is coupled through a series combination of resistor 124 and capacitor 126 to power supply conductor 32. A feedback resistor 128 is coupled between the output of operational amplifier 118 and its inverting input. Amplifier 118 operates as buffering circuit between the output of the combination of resistor network 112 and switching circuit 114 and the input of variable gain amplifier 70.

Resistors 66 and 72 are each shown as two resistors in parallel. The non-inverting input of operational amplifier 80 is coupled to power supply conductor 32 by way of resistors 130 and 132 and capacitor 134. The output of operational amplifier 80 is coupled through a series combination of resistor 136 and capacitor 138 to power supply conductor 32.

In FIG. 3, resistor networks 94 and 112 each provide incremental power settings of 0 dB, −10 dB, −20 dB and −30 dB while the dual interconnected potentiometers of variable resistor circuits 26 and 68 allows transimpedance amplifier 18 to be adjusted within each 10 dB range. By using a combination of the dual potentiometers variable resistor circuits 26 and 68 and resistor networks 94 and 112 in conjunction with tandem-operated switching circuits 96 and 114, the artist or end user can vary the power level to loudspeaker 16 continuously over a 40 dB range, while not disturbing any settings of power audio amplifier 14. Amplifier 14 still sees the complex impedance $Z_S$.

One advantage of the transimpedance amplifier is that power audio amplifier can be made to provide lesser or greater power to a load, while the nature of interaction between the power audio amplifier and the load remains constant. Transimpedance amplifier 18 will increase or decrease the power level from the power audio amplifier to make up the difference and drive loudspeaker 16 in the desired manner. Thus, power audio amplifier 14 thinks it's driving loudspeaker 16 when in reality is it driving an electronic amplifier.

The concept of the transimpedance amplifier is also applicable to other fields such as mechanical systems. In this case, the power audio amplifier is a mechanical control system. The transimpedance amplifier is an intermediate control system that provides amplification or attenuation while still providing the same tactile feedback. The mechanical control system could use an intermediate control system to increase or decrease the system response. For example, the mechanical control system could allow human control to perform very intricate and precise operations, such as handling and assembling small objects, or very large and bulky operations such as moving a heavy object. The mechanical control system could be used to control hydraulic pressure.

In battery applications, the transimpedance amplifier could be used to test or simulate the performance of any number of battery cells, given a small number of cells or even a single cell for testing. More generally, the present invention is applicable to any generator and load interface where it is desirable to change the power level transferred from the output of the generator to the load while maintaining an invariant the load constant to the generator. In the present embodiment, the combination of audio source 12 and power audio amplifier 14 operates as a sound generator. Loudspeaker 16 is a load to the sound generator. Transimpedance amplifier 18 provides the ability to vary the power level between the generator and the load, while maintaining the same load as seen by the sound generator.

Although the present invention has been described with respect to preferred embodiment(s), any person skilled in the art will recognize that changes may be made in form and detail, and equivalents may be substituted for elements of the invention without departing from the spirit and scope of the invention. Therefore, it is intended that the invention not be limited to the particular embodiments disclosed for carrying out this invention, but will include all embodiments falling within the scope of the appended claims.

What is claimed is:

1. An amplifier circuit having an input coupled for receiving an input signal and first and second load terminals, comprising:
    a first amplifier having an input coupled to the input of the amplifier circuit and an output coupled to the first load terminal;
    a sense amplifier having a first input coupled to the first load terminal and a second input coupled to the second load terminal;
    a second amplifier having an input coupled to an output of the sense amplifier; and
    a resistive element coupled between an output of the second amplifier and the input of the amplifier circuit.

2. The amplifier circuit of claim 1, further including a first controllable gain amplifier having an input coupled to the input of the amplifier circuit and an output coupled to the input of the first amplifier.

3. The amplifier circuit of claim 2, further including a second controllable gain amplifier having an input coupled to the output of the sense amplifier and an output coupled to the input of the second amplifier.

4. The amplifier circuit of claim 3, wherein the first and second controllable gain amplifiers are controlled in an opposite manner so that a gain of the first controllable gain amplifier is inversely proportional to a gain of the second controllable gain amplifier.

5. The amplifier circuit of claim 3, further including:
    a first resistor network having an input coupled to the output of the first controllable gain amplifier;
    a first switching circuit coupled between an output of the first resistor network and the input of the first amplifier;
    a second resistor network having an input coupled to the output of the sense amplifier; and
    a second switching circuit coupled between an output of the second resistor network and the input of the second controllable gain amplifier.

6. The amplifier circuit of claim 1, wherein the resistive element is a real impedance.

7. The amplifier circuit of claim 1, further including a power amplifier having an input coupled for receiving the input signal and an output coupled to the input of the amplifier circuit, wherein the power amplifier has a complex output impedance.

8. The amplifier circuit of claim 7, further including a loudspeaker coupled between the first and second terminals of the amplifier circuit, wherein the loudspeaker has a complex impedance.

9. The amplifier circuit of claim 8, wherein the complex impedance of the loudspeaker is maintained at the output of the power amplifier.

10. A method of controlling a gain of an amplifier circuit which receives an input signal while maintaining a complex load impedance at an input of the amplifier circuit, comprising:

controlling a gain of a first signal path from the input of the amplifier circuit to a first load terminal;

controlling a gain of a second signal path from the second load terminal to the input of the amplifier circuit;

receiving first and second sense signals at first and second load terminals respectively and subtracting the first sense signal from the second sense signal to provide a difference signal is the second signal path; and applying the difference signal through a resistive element to the input of the amplifier circuit to maintain the complex load impedance at the input of the amplifier circuit.

11. The method of claim 10, wherein the step of controlling a gain of a first signal path includes providing a controllable gain amplification from the input of the amplifier circuit to the first load terminal.

12. The method of claim 11, wherein the step of controlling a gain of a second signal path includes providing a controllable gain amplification the second load terminal to the input of the amplifier circuit.

13. The method of claim 12, wherein a gain of the first controllable gain amplification is inversely proportional to a gain of the second controllable amplification.

14. The method of claim 10, wherein the resistive element is a real impedance.

15. The method of claim 10, further including: providing a poker amplifier having an input coupled for receiving the input signal and an output coupled to the input of the amplifier circuit, wherein the power amplifier has a complex output impedance;

providing a loudspeaker coupled between the first and second load terminals, wherein the loudspeaker has a complex impedance; and maintaining the complex impedance of the loudspeaker at the output of the power amplifier.

16. A transimpedance amplifier having an input coupled for receiving an input signal and having first and second load terminals for coupling to a complex load impedance, comprising:

a forward signal path between the input of the transimpedance amplifier and the first load terminal for adjusting a gain of the input signal; and a return signal path between the second load terminal and the input of the transimpedance amplifier for routing a signal from the second loan terminal to the input of the transimpedance amplifier so as to maintain the complex load impedance at the input of transimpedance amplifier.

17. The transimpedance amplifier of claim 16, wherein the forward signal path includes a first amplifier having an input coupled to the input of the transimpedance amplifier and an output coupled to the first load terminal.

18. The transimpedance amplifier of claim 17, wherein the return signal path includes:

a sense amplifier having a first input coupled to the first load terminal and a second input coupled to the second load terminal;

a second amplifier having an input coupled to an output of the sense amplifier; and a resistive element coupled between an output of the second amplifier and the input of the transimpedance amplifier.

19. The transimpedance amplifier of claim 18, wherein the forward signal path further includes a first controllable gain amplifier having an input coupled to the input of the transimpedance amplifier and an output coupled to the input of the first amplifier.

20. The transimpedance amplifier of claim 19, wherein the return signal path further includes a second controllable gain amplifier having an input coupled to the output of the sense amplifier and an output coupled to the input of the second amplifier.

21. The transimpedance amplifier of claim 18, wherein the resistive element is a real impedance.

22. The transimpedance amplifier of claim 16, further including:

a power amplifier having an input coupled for receiving the input signal and an output coupled to the input of the transimpedance amplifier, wherein the power amplifier has a complex output impedance; and a loudspeaker coupled between the first and second load terminals for providing the complex impedance, wherein the complex impedance of the loudspeaker is maintained at the output of the power amplifier.

23. A generator and load interface system having an input coupled for receiving an input signal representative of a physical phenomenon and having first and second load terminals for coupling to a complex impedance, comprising:

a first signal path between the input of the generator and load interface system and the first load terminal for adjusting gain of the input signal; and a second signal path between the second load terminal and the input of the generator and load interface system for routing a signal from the second load terminal to the input of the transimpedance amplifier so as to maintain the complex impedance at the input of the generator and load interface system.

24. The generator and load interface system of claim 23, wherein the first signal path includes:

a first controllable gain amplifier having an input coupled for receiving the input signal; and a power amplifier having an input coupled to an output of the first controllable gain amplifier and an output coupled to the first load terminal.

25. The generator and load interface system of claim 24, wherein the second signal path includes:

a sense amplifier having a first input coupled to the first load terminal and a second input coupled to the second load terminal;

a second controllable gain amplifier having an input coupled to an output of the sense amplifier;

a load amplifier having an input coupled to an output of the second controllable gain amplifier; and a resistive element coupled between an output of the load amplifier and the input of the generator and load interface system.

26. The generator and load interface system of claim 25, wherein the resistive element is a real impedance.

* * * * *

UNITED STATES PATENT AND TRADEMARK OFFICE
CERTIFICATE OF CORRECTION

PATENT NO. : 6,816,009 B2
DATED : November 9, 2004
INVENTOR(S) : William Edward Hughes and Richard W. Faith It is certified that error appears in the above-identified patent and that said Letters Patent is hereby corrected as shown below:

Column 11,
Line 40, change "poker" to -- power --.

Signed and Sealed this

Fifth Day of April, 2005

JON W. DUDAS
*Director of the United States Patent and Trademark Office*